(12) United States Patent
Tsao et al.

(10) Patent No.: US 7,679,180 B2
(45) Date of Patent: Mar. 16, 2010

(54) BOND PAD DESIGN TO MINIMIZE DIELECTRIC CRACKING

(75) Inventors: Pei-Haw Tsao, Tai-Chung (TW); Liang-Chen Lin, Baoshan Shiang (TW); Pao-Kang Niu, Hsinchu (TW); I-Tai Liu, Yung-Ho (TW); Bill Kiang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 301 days.

(21) Appl. No.: 11/557,372

(22) Filed: Nov. 7, 2006

(65) Prior Publication Data

US 2008/0122100 A1   May 29, 2008

(51) Int. Cl.
  *H01L 23/12*  (2006.01)
  *H05K 7/00*  (2006.01)
  *H01L 21/44*  (2006.01)

(52) U.S. Cl. ............... 257/700; 257/758; 257/774; 257/E23.145; 361/777; 438/612; 438/622

(58) Field of Classification Search .............. None
  See application file for complete search history.

(56) References Cited

U.S. PATENT DOCUMENTS

| | | | |
|---|---|---|---|
| 5,707,894 A | 1/1998 | Hsiao | |
| 5,731,243 A | 3/1998 | Peng et al. | |
| 5,736,791 A * | 4/1998 | Fujiki et al. | 257/781 |
| 5,739,587 A * | 4/1998 | Sato | 257/758 |
| 6,002,179 A | 12/1999 | Chan et al. | |
| 6,025,277 A | 2/2000 | Chen et al. | |
| 6,028,367 A * | 2/2000 | Yu | 257/780 |
| 6,100,589 A * | 8/2000 | Tanaka | 257/758 |
| 6,232,662 B1 | 5/2001 | Saran | |
| 6,236,114 B1 | 5/2001 | Huang et al. | |
| 6,313,540 B1 | 11/2001 | Kida et al. | |
| 6,465,895 B1 | 10/2002 | Park et al. | |
| 6,566,752 B2 | 5/2003 | Hsia et al. | |
| 6,717,238 B2 * | 4/2004 | Ker et al. | 257/602 |
| 6,740,985 B1 | 5/2004 | Zhao | |
| 6,875,682 B1 | 4/2005 | Liu et al. | |
| 7,057,296 B2 | 6/2006 | Hung et al. | |
| 7,148,574 B2 * | 12/2006 | Lee et al. | 257/773 |
| 7,160,795 B2 * | 1/2007 | Batra et al. | 438/612 |
| 7,298,051 B2 * | 11/2007 | Saito | 257/784 |
| 7,446,029 B2 * | 11/2008 | Saito | 438/612 |

* cited by examiner

*Primary Examiner*—Alonzo Chambliss
(74) *Attorney, Agent, or Firm*—Duane Morris LLP; Jeffrey M. Chamberlain

(57) ABSTRACT

An improved via arrangement for a bonding pad structure is disclosed comprising an array of vias surrounded by a line via. The line via provides a barrier to cracks in the dielectric layer encompassing the via array. Although cracks are able to spread relatively unhindered between the vias of the via array, they are blocked by the line via and thus can not spread to neighboring regions of the chip or wafer. The line via can be provided in a variety of shapes and dimensions, to suit a desired application. Additionally, due to its substantially uninterrupted length, the line via provides added strength to the bond pad.

14 Claims, 3 Drawing Sheets

"Prior Art"

"Prior Art"

BOND PAD DESIGN TO MINIMIZE DIELECTRIC CRACKING

FIELD OF THE INVENTION

The present invention relates generally to semiconductor integrated circuit processing and more particularly to bond pad structures that minimize inter-metal dielectric cracking.

BACKGROUND OF THE INVENTION

Bonding pads are the interfaces between the integrated circuits contained in semiconductor chips and the chip package. A large number of bonding pads is required to transmit power, ground and input/output signals to the chip devices. It is thus important that the bonding pad yield be sufficiently high to ensure a high per chip yield.

A typical bonding pad structure consists of metal layers, emanating from the terminals of a chip device, separated by inter-metal dielectric (IMD) layers that are often silicon oxide. Metal vias pass through the IMD layers to connect the metal layers. Wires are bonded to a bonding metal pattern and to the chip package forming electrical connections between the chip and the package. A passivation layer covers the surface, except over the bonding sites, to seal the chip from contaminants and to provide scratch protection.

One mode of failure of the bonding pad relates to the peeling of the wire from the metal pattern due to forces exerted especially during the bonding process. Another failure mode that has been observed relates to bonding pad peel back, where forces imparted during wire bonding may cause a delaminating of one or more of the underlying layers. Another failure mode involves cracking of the IMD material.

A conventional bond pad 1 for an integrated circuit (IC) wafer is illustrated in FIGS. 1A and 1B. A pair of bond pad metal layers 2A, B are connected by an array of conductive vias 10. The bond pad metal layers 2A, B are separated by a layer of dielectric material 12, within which the vias 10 are disposed. During manufacturing, such as IC probe testing and during package assembly wire-bonding processes, external forces are applied to the bond pad 1. These forces may cause cracks 14 to form in the dielectric material 12 between the vias 10. Because the propagation path for these cracks 14 is largely uninhibited, the cracks 14 often extend to the area 16 outside the bond pad. Such cracking can cause current leakage, interlayer shorts, corrosion and reduced reliability of the IC. Moreover, large cracks 14 may cause failure of the IC very early in the life stage of the product in which the IC is used.

Thus, there is a need for an improved arrangement for metal vias that will minimize the chances for cracks to occur in the IMD, and where such cracks do occur, to minimize and/or limit their propagation. Such an arrangement should also be inexpensive to manufacture.

SUMMARY OF THE INVENTION

A bonding pad structure is disclosed, comprising a first conductive material layer, a layer of dielectric material disposed over the first conductive material layer and a second conductive material layer. A plurality of conductive vias may be disposed within the layer of dielectric material, said conductive vias being in electrical contact with the first and second conductive material layers. Further, a line via may be disposed about a perimeter of said plurality of conductive vias, said line via disposed within said layer of dielectric material.

A bonding pad is also disclosed, comprising first, second and third conductive material layers. The bonding pad may also comprise first and second layers of dielectric material, the first layer of dielectric material disposed between the first and second conductive material layers, and the second layer of dielectric material disposed between the second and third conductive material layers. A first plurality of conductive vias may be disposed within the first layer of dielectric material to electrically connect the first and second conductive material layers. A second plurality of conductive vias may be disposed within the second layer of dielectric material to electrically connect the second and third conductive material layers. A first line via may be disposed within said first layer of dielectric material, said first line via having an inner perimeter substantially surrounding said first plurality of conductive vias. Thus, arranged, cracks in said first layer of dielectric material are contained between said first and second conductive material layers and said inner perimeter of said first line via.

A method of forming a bonding pad is also disclosed, comprising: providing a semiconductor wafer; forming a first dielectric layer over the wafer; forming a first conductive material layer over the first dielectric layer; forming a second dielectric layer over the first conductive material layer; patterning the second dielectric layer to form a plurality of openings therein, said plurality of openings comprising a central array of openings and a line opening substantially surrounding said central array of openings; providing conductive material within said plurality of openings; and providing a second conductive material layer over said second dielectric layer and said conductive material within said plurality of openings; wherein cracks in said second dielectric layer are contained between said first and second conductive material layers and an inner perimeter of said conductive material disposed within said line opening.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein.

DETAILED DESCRIPTION

According to an embodiment of the present invention, disclosed herein is a design for a bonding pad using an array of vias, the arrangement of which minimizes cracking of IMD material that often occurs during wafer handling and processing.

Figure 1A:
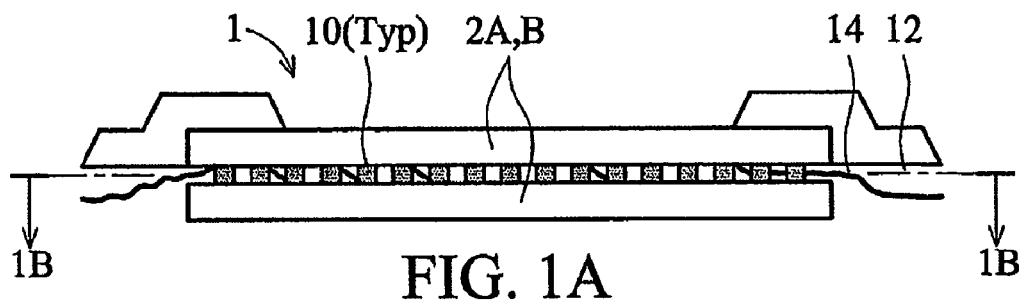
FIGS. 1A and 1B illustrate conventional via patterns of a typical bonding pad showing propagated cracks in the inter-metal dielectric (IMD) layer.
Figure 1B:
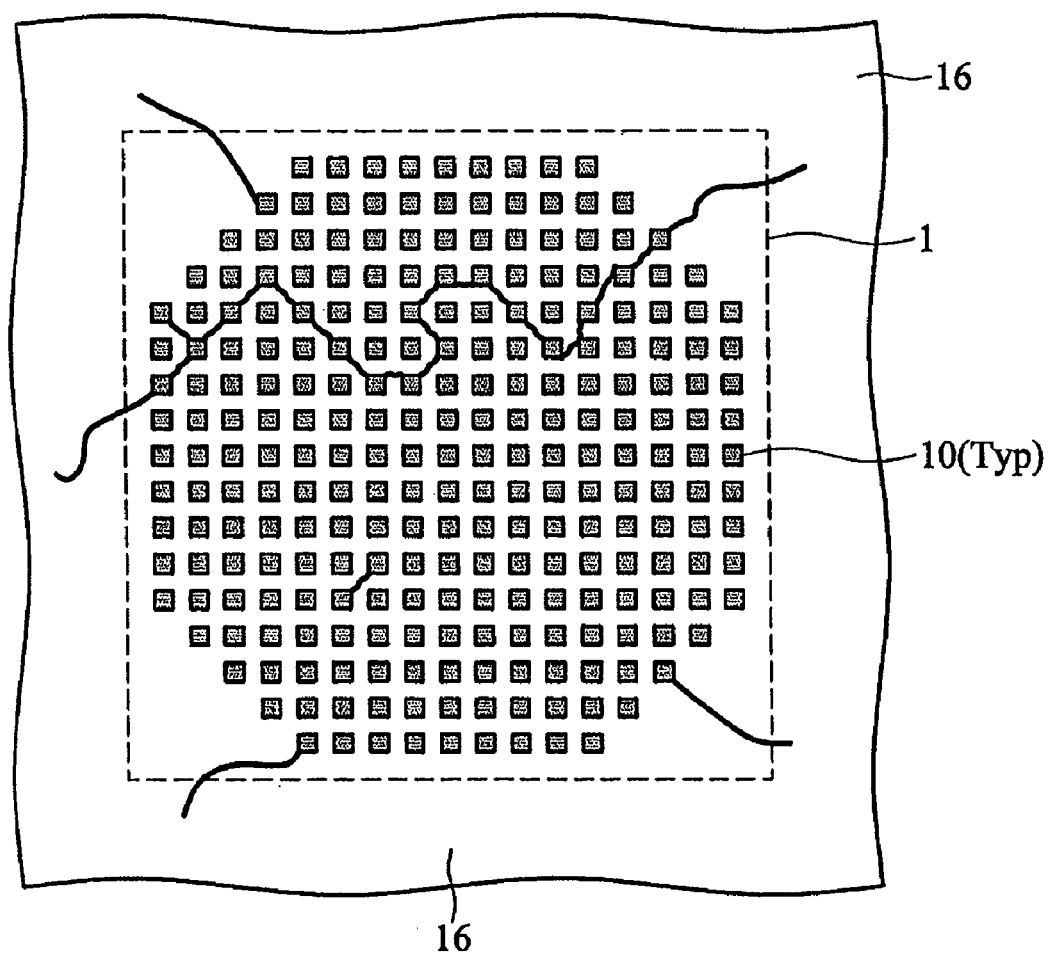
Figure 2A:
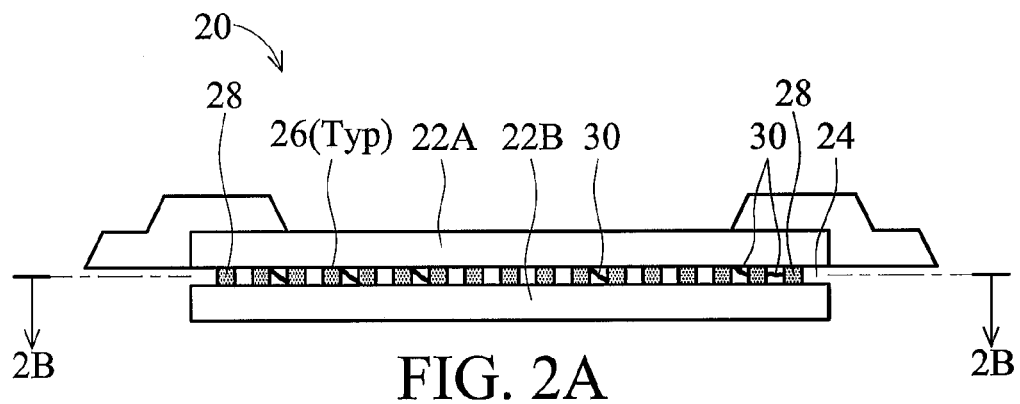
FIGS. 2A and 2B are cross-section and plan views, respectively, of an exemplary semiconductor wafer incorporating the novel bond pad and line via arrangement.
Figure 2B:
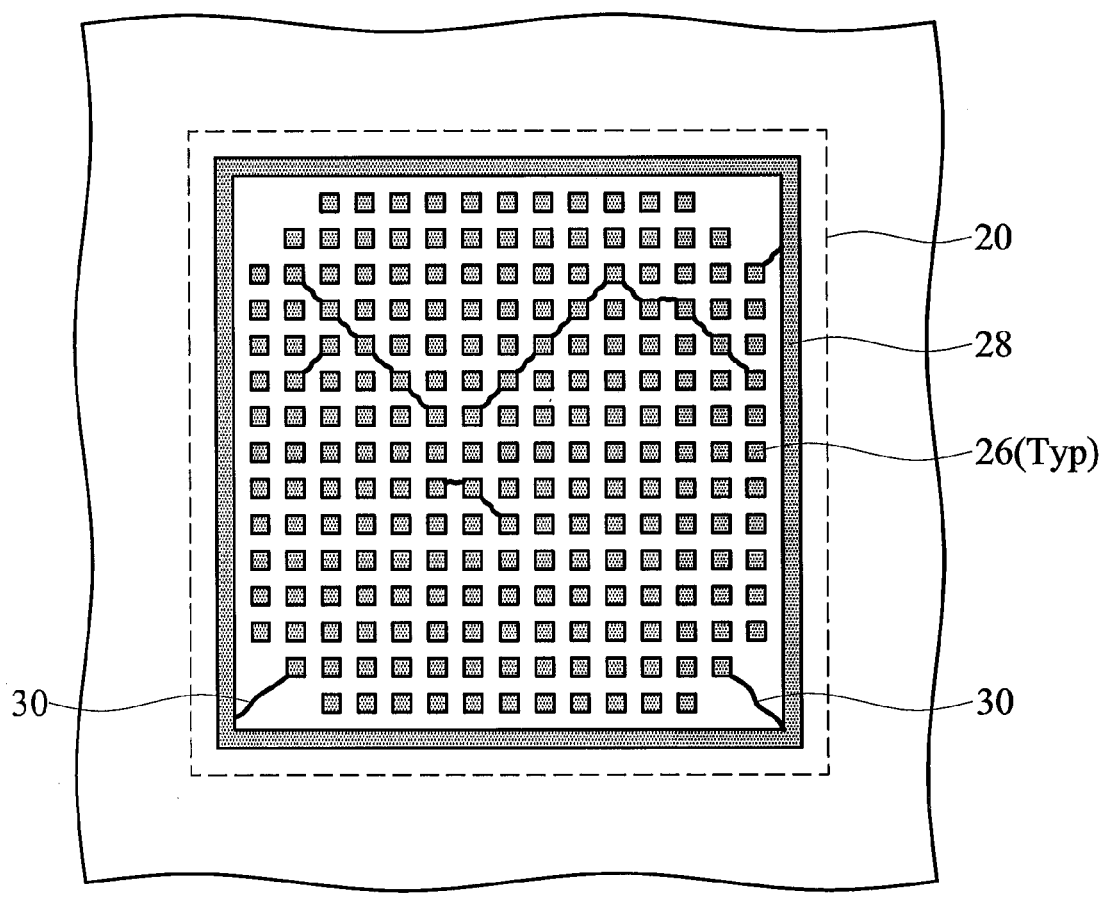

Referring to FIGS. 2A and 2B, the novel bonding pad 20 comprises a pair of bond pad metal layers 22A, 22B, with a layer of inter-metal dielectric (IMD) 24 disposed therebetween. A plurality of conductive vias 26 are disposed within the IMD layer 24, and form individual electrical contacts between the bond pad metal layers 22A, B. Additionally, a conductive line via 28 is disposed about the perimeter of the plurality of vias 26. In addition to forming an electrical contact between the bond pad metal layers, the line via 28 encompasses the vias 26 to form an isolation barrier that prevents propagation of cracks 30 in the IMD layer 24 that may occur during wire bond processing. Thus, even if a crack 30 initiates in the IMD layer 24, it can only propagate as far as the line via 28, and can not extend into the area outside the area of the bond pad 20.

Figure 3:
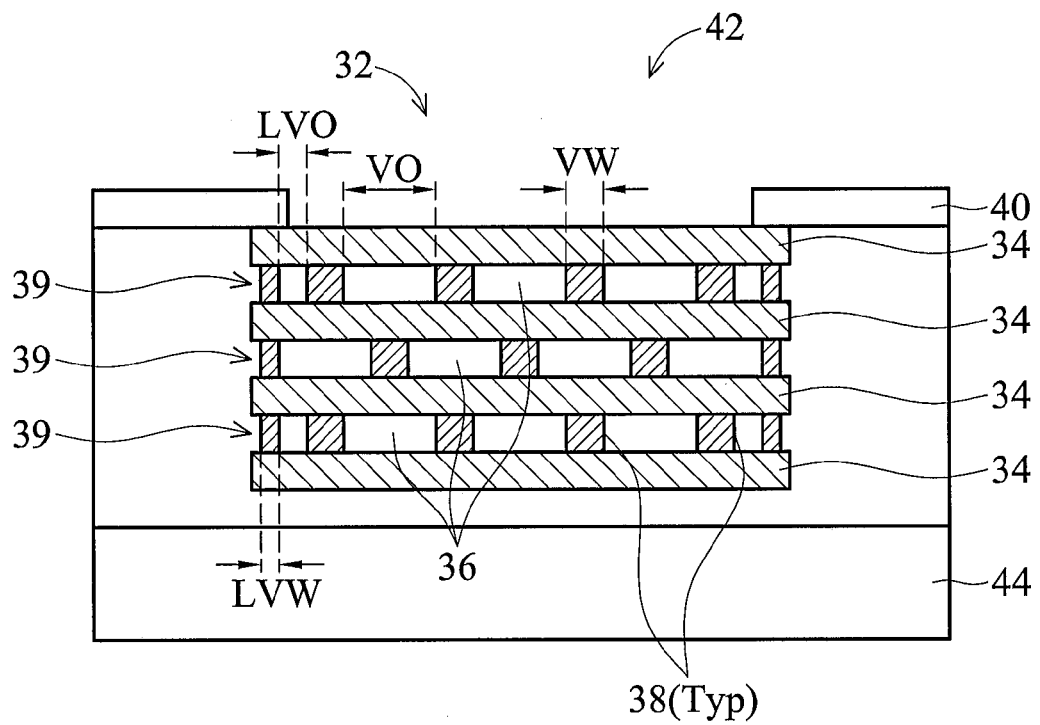
FIG. 3 is a cross-section view of a multilayer bonding pad implementing the novel line via arrangement.

Referring to FIG. 3, the basic elements of a multilayer bonding pad structure 32 are illustrated in FIG. 3, and consist of a plurality of metal layers 34 emanating from the terminals of a chip device (not shown), separated by IMD layers 36. Each metal layer 34 may be electrically connected to an adjacent metal layer 34 by a plurality of conductive vias 38, as well as by a line via 39 that surrounds the plurality of conductive vias 38 on that particular level. A passivation layer 40 covers the surface of the topmost metal layer 34, except over the bonding site, to seal the chip 42 from contaminants and to provide scratch protection. Wires may be bonded directly to the topmost metal layer 34 at the bonding site, or they may be bonded to an intervening bonding metal pattern and to the chip package, thus forming electrical connections between the chip 42 and the package.

As shown in FIG. 3, the inventive via and line via arrangement shown in FIGS. 2A, 2B can be implemented between any two adjacent levels of metal 34 in such a multilevel bonding pad 32. The crack resistance properties of the via arrangement may be most effectively utilized when disposed between the top two metal layers.

In addition to providing a barrier to IMD crack propagation, the line vias 39 may provide enhanced resistance to stresses arising during chip packaging processes. In contrast to typical bonding pads in which pad compressive strength is provided only by the square vias 38, the line via 39 lends substantial strength to the bonding pad due to its uninterrupted length surrounding the plurality of vias 38. Thus, the line via 39 may have a size and shape selected to maximize both the electrical connection between the contacted metal layers, and to maximize the strength of the bond pad to resist cracking and other damage due to stresses imposed during manufacture. In one embodiment, the line via 39 may have a width "LVW" of from about 0.5 times to about 2 times the width "VW" of via 38. A minimum offset "LVO" between the line via 39 and the nearest via 38 may be about the same as the spacing "VO" between adjacent vias 38. It will be appreciated that although the illustrated embodiment shows a line via 39 having a square shape, other shapes can also be provided.

Figure 4:
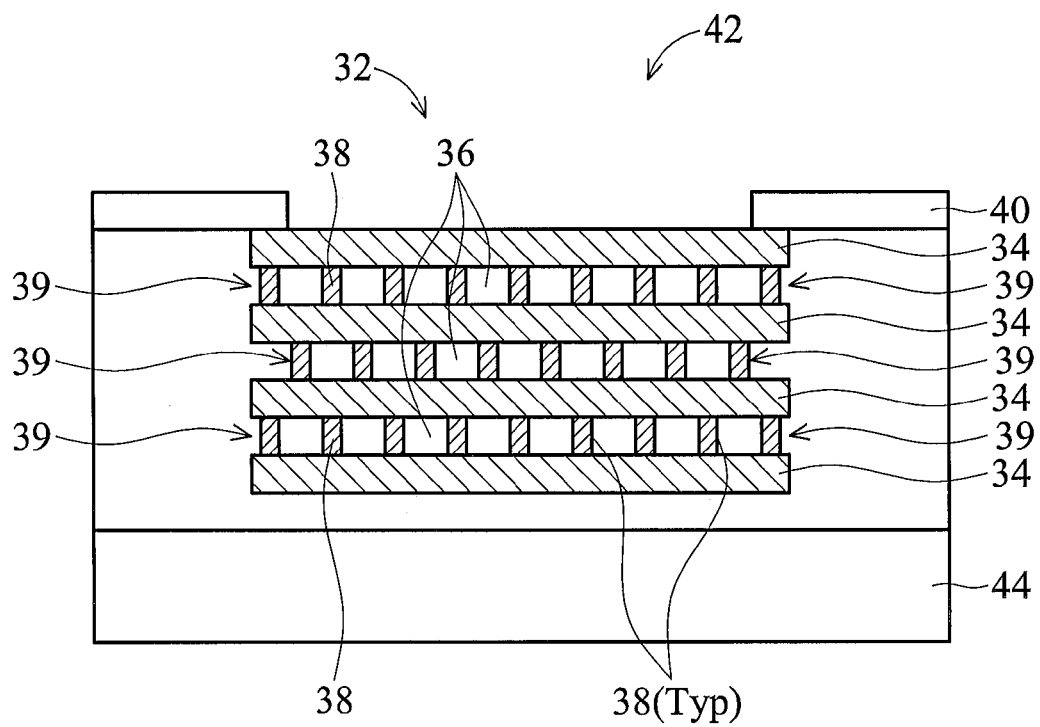
FIG. 4 is a cross-section view of a multilayer bonding pad implementing an alternative line via arrangement between successive metal layers.

Additionally, although the embodiment illustrated in FIG. 3 shows a line via 39 disposed between each of the metal layers 34, it may be desirable to employ only a single line via 39 between the top two metal layers and to employ only square vias between the remaining metal layers. Further, where line vias 39 are provided on multiple levels (as in FIG. 3), it may be desirable to offset the line vias 39 of adjacent levels as shown in FIG. 4 to further enhance the strength of the bonding pad 32.

The line via layout is, as previously noted, designed to separate the IMD 36 of the bonding pad 32 from the remainder of the wafer or device, so that when the openings are filled with conductive material, the vias 38 are surrounded by a conductive-material filled line via 39. Thus, a simplified high strength via arrangement may be provided which also limits IMD crack sizes to the diagonal dimension of the line via 39.

As previously noted, although a rectilinear line vias 39 is shown in FIG. 2B, other shapes may also be provided.

It will also be appreciated that although the dielectric layers 36 are each shown as being singularly deposited layers, one or more of these layers 36 could be a composite dielectric layer. Such a composite layer may relieve internal stress in the dielectric, since such internal stresses can contribute to cracking in the dielectric layer. A non-limiting example of such composite dielectric layers include dual oxide layers, in which one of the composite layers is formed using a high density plasma (HDP) process, and a second of the composite layers is formed using Plasma Enhanced Tetraethylorthosilicate (PETEOS).

A method of forming the disclosed via and line via arrangement is also disclosed. The method can be carried out by first providing a pre-processed electronic substrate 44 and depositing a dielectric material thereon to form a dielectric layer 36. A metal layer 34 may be formed within the dielectric layer 36, followed by the deposition of another dielectric layer 36. A plurality of openings may be formed in the dielectric layer 36, and these openings may then be filled with a conductive material to form an array of vias 38. The openings may be square or rounded to form square or rounded conductive vias. Further, a ring-shaped opening may be provided in the dielectric layer 36. This ring shaped opening may surround the other openings so that when the ring-shaped opening is filled with conductive material a line array 39 is formed around the array of vias 38 (see FIG. 2A).

In one embodiment, filling of the vias 38, 39 may be accomplished using a W plug process. Alternatively, Al plug, Cu plug or silicide plug processes may also be used. Following the filling of the vias 38 and line via 39 with conductive material, chemical-mechanical polishing (CMP) may be used to planarize the surface.

As will be appreciated, the process of forming a metal layer 34, dielectric layer 36, vias 38 and line vias 39 may then be repeated as desired to form a multilayer bond pad structure such as that illustrated in FIG. 3. Bonding metal patterns may then be deposited on the top surface of the top most metal layer 34. Wires may then be bonded to the bonding metal patterns.

While the foregoing invention has been described with reference to the above embodiments, various modifications and changes can be made without departing from the spirit of the invention. Accordingly, all such modifications and changes are considered to be within the scope and range of equivalents of the appended claims.

The invention claimed is:

1. A bonding pad, comprising:
   first, second and third conductive material layers;
   first and second layers of dielectric material, the first layer of dielectric material disposed between the first and second conductive material layers, and the second layer of dielectric material disposed between the second and third conductive material layers;
   a first plurality of conductive vias disposed within the first layer of dielectric material to electrically connect the first and second conductive material layers;
   a second plurality of conductive vias disposed within the second layer of dielectric material to electrically connect the second and third conductive material layers; and
   a first line via disposed within said first layer of dielectric material, said first line via having an inner perimeter substantially surrounding said first plurality of conductive vias;

a second line via disposed within said second layer of dielectric material, said second line via having an inner perimeter substantially surrounding said second plurality of conductive vias;

wherein the second line via is laterally offset from the first line via, so the second line via is not directly above the first line via.

2. The bonding pad of claim 1, wherein said first or second line via comprises a rectilinear shape defined by an outer perimeter and said inner perimeter.

3. The bonding pad of claim 1, wherein said first line via completely surrounds said first plurality of conductive vias.

4. The bonding pad of claim 1, further comprising bonding metal patterns disposed over a top surface of said third conductive material layer, and bonding wires connected to said bonding metal patterns.

5. The bonding pad of claim 1, wherein at least one of said first and second layers of dielectric material comprises a composite of dielectric layers.

6. The bonding pad of claim 1, wherein cracks in said second layer of dielectric material are contained between said second and third conductive material layers and said inner perimeter of said second line via.

7. The bonding pad of claim 1, further comprising:

a third plurality of conductive vias disposed within the third layer of dielectric material a third line via disposed within said third layer of dielectric material, said third line via having an inner perimeter substantially surrounding said third plurality of conductive vias;

wherein the third line via is laterally offset from the second line via, so the third line via is not directly above the second line via.

8. The bonding pad of claim 7, wherein the third line via is aligned with the first line via.

9. A method of forming a bonding pad, comprising:
providing a semiconductor wafer;
forming a first dielectric layer over the wafer;
forming a first conductive material layer over the first dielectric layer;
forming a second dielectric layer over the first conductive material layer;

pattering the second dielectric layer to form a plurality of openings therein, said plurality of openings comprising a central array of openings and a line opening substantially surrounding said central array of openings;

providing conductive material within said plurality of openings to form a plurality of conductive vias surrounded by a line via; and providing a second conductive material layer over said second dielectric layer and said conductive material within said plurality of openings;

forming a third dielectric layer over said second conductive material layer, patterning the third dielectric layer to form a second plurality of openings therein, said second plurality of openings comprising a central array of openings and a line opening substantially surrounding said central array of openings; and providing conductive material within said second plurality of openings to form a second plurality of conductive vias surrounded by a second line via;

wherein the second line via is laterally offset from the first line via, so the second line via is not directly above the first line via.

10. The method of claim 9, wherein the step of providing a second dielectric layer comprises providing a composite of dielectric layers.

11. The method of claim 9, wherein said conductive material within said plurality of openings comprises tungsten, aluminum, copper or silicide.

12. The method of claim 9, wherein said line via comprises a rectilinear shape defined by an outer perimeter and said inner perimeter.

13. The method of claim 9, wherein an inner perimeter of the line opening in the second dielectric layer has a dimension different from a corresponding dimension of the line opening in the third dielectric layer.

14. The method of claim 9, wherein an inner perimeter of the line opening in the second dielectric layer has a dimension that is substantially the same as a corresponding dimension of the line opening in the third dielectric layer.

* * * * *

UNITED STATES PATENT AND TRADEMARK OFFICE
CERTIFICATE OF CORRECTION

| | | |
|---|---|---|
| PATENT NO. | : 7,679,180 B2 | Page 1 of 1 |
| APPLICATION NO. | : 11/557372 | |
| DATED | : March 16, 2010 | |
| INVENTOR(S) | : Pei-Haw Tsao et al. | |

It is certified that error appears in the above-identified patent and that said Letters Patent is hereby corrected as shown below:

Column 6, Claim 9, Line 1, delete "pattering" and insert -- patterning --.

Signed and Sealed this

Eighteenth Day of May, 2010

David J. Kappos
*Director of the United States Patent and Trademark Office*